(12) United States Patent
Satoh

(10) Patent No.: US 7,230,502 B2
(45) Date of Patent: Jun. 12, 2007

(54) EMITTER COUPLED LOGIC OSCILLATOR CIRCUIT

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 10/813,342

(22) Filed: Mar. 30, 2004

(65) Prior Publication Data

US 2004/0189414 A1    Sep. 30, 2004

(30) Foreign Application Priority Data

Mar. 31, 2003    (JP) .............................. 2003-097417

(51) Int. Cl.
*H03B 5/36*    (2006.01)
(52) U.S. Cl. .................... 331/116 R; 331/158
(58) Field of Classification Search ............ 331/116 R, 331/158, 116 FE, 74
See application file for complete search history.

(56) References Cited

U.S. PATENT DOCUMENTS 5,136,263 A * 8/1992 Lane .......................... 331/158

FOREIGN PATENT DOCUMENTS

EP    0230876 A1 *   1/1987

* cited by examiner

*Primary Examiner*—Joseph Chang
(74) *Attorney, Agent, or Firm*—Koda & Androlia

(57) ABSTRACT

In a piezoelectric oscillator a non-inverted output terminal (3) of an ECL circuit (10) is grounded via a capacitor (C3) and is connected to a non-inverting input terminal (5) of the ECL circuit (10) via a series connection of capacitors (C4) and (C5). The non-inverting input (5) is connected via a resistor R1 to an inverting input terminal (4) of the ECL circuit (10) and is grounded via a capacitor (C2). The connection point of the series connection of the capacitors (C4) and (C5) is grounded via a crystal oscillator (X'tal) and a frequency control capacitor (C1). The output from the ECL circuit (10) is provided at its inverted output terminal 2.

3 Claims, 6 Drawing Sheets

PRIOR ART

EMITTER COUPLED LOGIC OSCILLATOR CIRCUIT

FIELD OF THE INVENTION

This invention relates to a piezoelectric oscillator and, more particularly, to a circuit configuration of a piezoelectric oscillator having a built-in ECL (Emitter Coupled Logic) circuit.

BACKGROUND OF THE INVENTION

With the recent progress in portable telephony, there is a growing demand for small but stable crystal oscillators. In particular, stable high-frequency oscillation and low power dissipation are greatly to be desired. FIG. 6 shows a conventional ECL (Emitter Coupled Logic) oscillation circuit. This ECL oscillation circuit is made up of: the ECL circuit 20 having non-inverting and inverting input terminals 21 and 22 and non-inverted and inverted output terminals 24 and 23; a frequency control capacitor C11; a crystal oscillator X'tal; a resistor R11; a capacitor C12; and pull-up resistors R12 and R13.

The ECL circuit 20 has its non-inverted output terminal 24 and non-inverting input terminal 21 interconnected via a series connection of the frequency control capacitor C11 and the crystal oscillator X'tal. The non-inverting input terminal 21 is connected via the resistor R11 to the inverting input terminal 22, which is grounded via the capacitor C12. The non-inverted and inverted output terminals 24 and 23 are connected to their power supplies via the pull-up resistors R12 and R13, respectively. The illustrated circuit is configured to provide its output via the non-inveted output terminal 24.

The conventional ECL oscillation circuit of FIG. 6 oscillates with the series connection of the frequency control capacitor C11 and the crystal oscillator X'tal inserted between the non-inverted output terminal 24 and the non-inverting input terminal 21 of the ECL circuit 20. In this instance, the delay between the non-inverted output terminal 24 and non-inverting input terminal 21 serves as an effective inductor, which combines with the capacitance of the series connection of the frequency control capacitor C11 and the crystal oscillator X'tal, thereby causing oscillation.

In the conventional circuit of FIG. 6, the delay between the non-inverted output terminal 24 and non-inverting input terminal 21 of the ECL circuit 20 serves as an effective inductor for oscillation. But the delay time between the non-inverted output terminal 24 and the non-inverting input terminal 21 is likely to vary greatly from one ECL circuit to another even if they are mass-produced with single design. Hence, the oscillation conditions may sometimes become inadequate according to the particular ECL circuit used, resulting in impaired stability of oscillation.

SUMMARY OF THE INVENTION

It is therefore an object of the present invention to provide a piezoelectric oscillator of increased stability of oscillation frequency with a simple circuit configuration.

According to a first aspect of the present invention, there is provided a piezoelectric oscillator comprising: a piezoelectric element to be excited at a predetermined frequency; and an ECL circuit for exciting said piezoelectric element by supplying current to said piezoelectric element; wherein: a non-inverted output terminal of said ECL circuit is grounded via a capacitor, and is connected to a non-inverting input terminal of said ECL circuit via series-connected capacitors; said non-inverting input terminal of said ECL circuit is connected via a resistor to an inverting input terminal of said ECL circuit, and is grounded via a capacitor; and the connection point of said series-connected capacitors is grounded via said piezoelectric element and a frequency control element.

The above circuit configuration is directed to a Colpitts oscillation circuit of the type wherein: the non-inverted output terminal of the ECL circuit is grounded via a capacitor and is connected to the non-inverting input terminal of the ECL circuit via a plurality of series-connected capacitors; the non-inverting input terminal is connected via a resistor to the inverting input terminal of the ECL circuit and is further grounded via a capacitor; and the connection point of the series-connected capacitors is grounded via a piezoelectric oscillator and a frequency control element.

The oscillation circuit of the above configuration prevents variations of individual ECL circuits from affecting the oscillation frequency, and hence it provides for increased stability of oscillation frequency.

According to a second aspect of the present invention, there is provided a piezoelectric oscillator comprising: a piezoelectric element to be excited at a predetermined frequency; and an ECL circuit for exciting said piezoelectric element by supplying current to said piezoelectric element; wherein: an inverted output terminal of said ECL circuit is grounded via a capacitor, and is connected to an inverting input terminal of said ECL circuit via a capacitor; said inverting input terminal of said ECL circuit is connected via a resistor to a non-inverting input terminal of said ECL circuit, and is grounded via a capacitor; and said inverting input terminal of said ECL circuit is grounded via said piezoelectric element and a frequency control element.

In the piezoelectric oscillator according to the first aspect of the invention the non-inverted output terminal of the ECL circuit is grounded via a capacitor and is connected to the non-inverting input terminal of the ECL circuit via a plurality of series-connected capacitors and the connection point of the series-connected capacitors is grounded via the piezoelectric element and the frequency control element, whereas in the piezoelectric oscillator according to the second aspect of the invention the inverted output terminal of the ECL circuit is grounded via a capacitor and is connected via one capacitor to the inverting input terminal of the ECL circuit and the inverting input terminal is grounded via the piezoelectric element and the frequency control element.

With the above circuit configuration according to the second aspect of the invention, too, it is possible to obtain the same working effect as is obtainable with the circuit configuration according to the first aspect of the invention.

According to a third aspect of the present invention, the series-connected capacitors, which are connected to the non-inverting and inverting input terminals of the ECL circuit, respectively, are each to set a negative resistance value of the piezoelectric oscillator.

In the Colpitts oscillation circuit, values of the capacitors connected to the non-inverting and inverting input terminals of the ECL circuit, respectively, are each the load capacitance of the oscillation circuit. Accordingly, these capacitors are used to set the negative resistance value, which needs to be maximized. The negative resistance value is a vital factor for stabilization of the oscillation circuit according to this invention.

According to the third aspect of the invention, it is possible to implement a stable oscillation circuit since the values of capacitors connected to the non-inverting an inverting input terminals of the ECL circuit, respectively, are each used as the negative resistance value of the oscillation circuit.

DETAILED DESCRIPTION OF THE PREFERRED EMBODIMENTS

Referring now to FIGS. 2 to 5, the present invention will be described below in detail. It must be understood that the embodiments described below are intended as not limiting the invention specifically thereto but as being merely illustrative of the invention. Further, while the present invention will be described as being applied to a crystal oscillator, it is apparent that the invention is applicable to other piezoelectric oscillators.

First Embodiment

Figure 1:
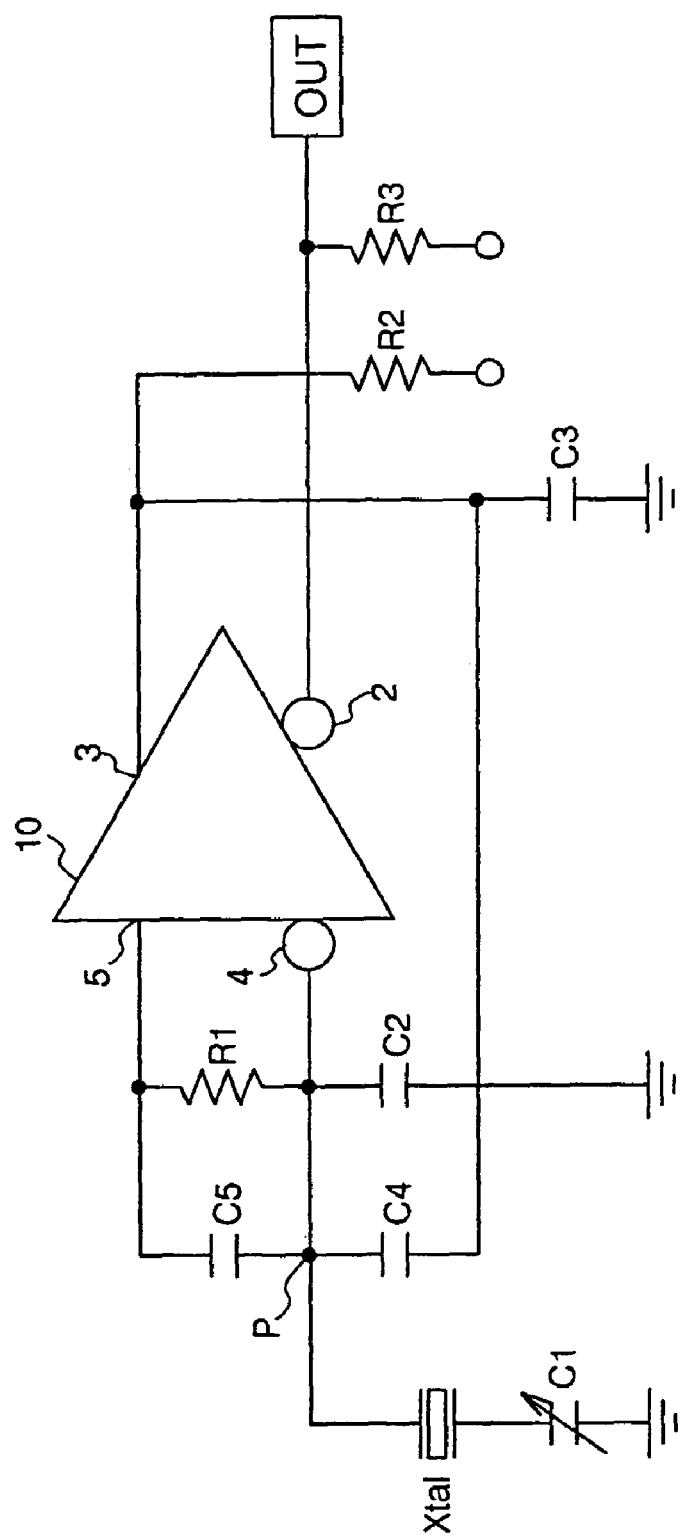
FIG. 1 is a circuit diagram illustrating an ECL oscillator according to a first embodiment of the present invention.

FIG. 1 illustrates the ECL oscillator according to a first embodiment of the present invention. This ECL oscillation circuit is composed of: an ECL (Emitter Coupled Logic) circuit 10 having inverting and non-inverting input terminals 4 and 5 and inverted and non-inverted output terminals 3 and 2; a frequency control capacitor C1; a crystal oscillator X'tal; a resistor R1; capacitors C2 to C5; and pull-down resistors R2 and R3.

The non-inverted output terminal 3 of the ECL circuit 10 is grounded via the capacitor C2, and is connected to the non-inverting input terminal 5 via series-connected capacitors C4 and C5. The non-inverting input terminal 5 is connected via the resistor R1 (for DC bias) to the inverting input terminal 4 of, and is grounded via the capacitor (AC grounding bypass capacitor) C2. The connection point P of the series-connected capacitors C4 and C5 is grounded via the crystal oscillator X'tal and the frequency control capacitor C1. The circuit of this embodiment is configured to provide its output from the inverted output terminal 2.

In this ECL oscillation circuit of such a configuration as above described, the capacitor C5 is to set mainly a negative resistance, which is set to an appropriate value in view of a tradeoff between it and equivalent series resistance of the oscillator X'tal. As a result, a Colpitts oscillation circuit is formed which uses the capacitors C1, C3, C4, and C5, and the crystal oscillators X'tal as oscillation loop elements.

Second Embodiment

Figure 2:
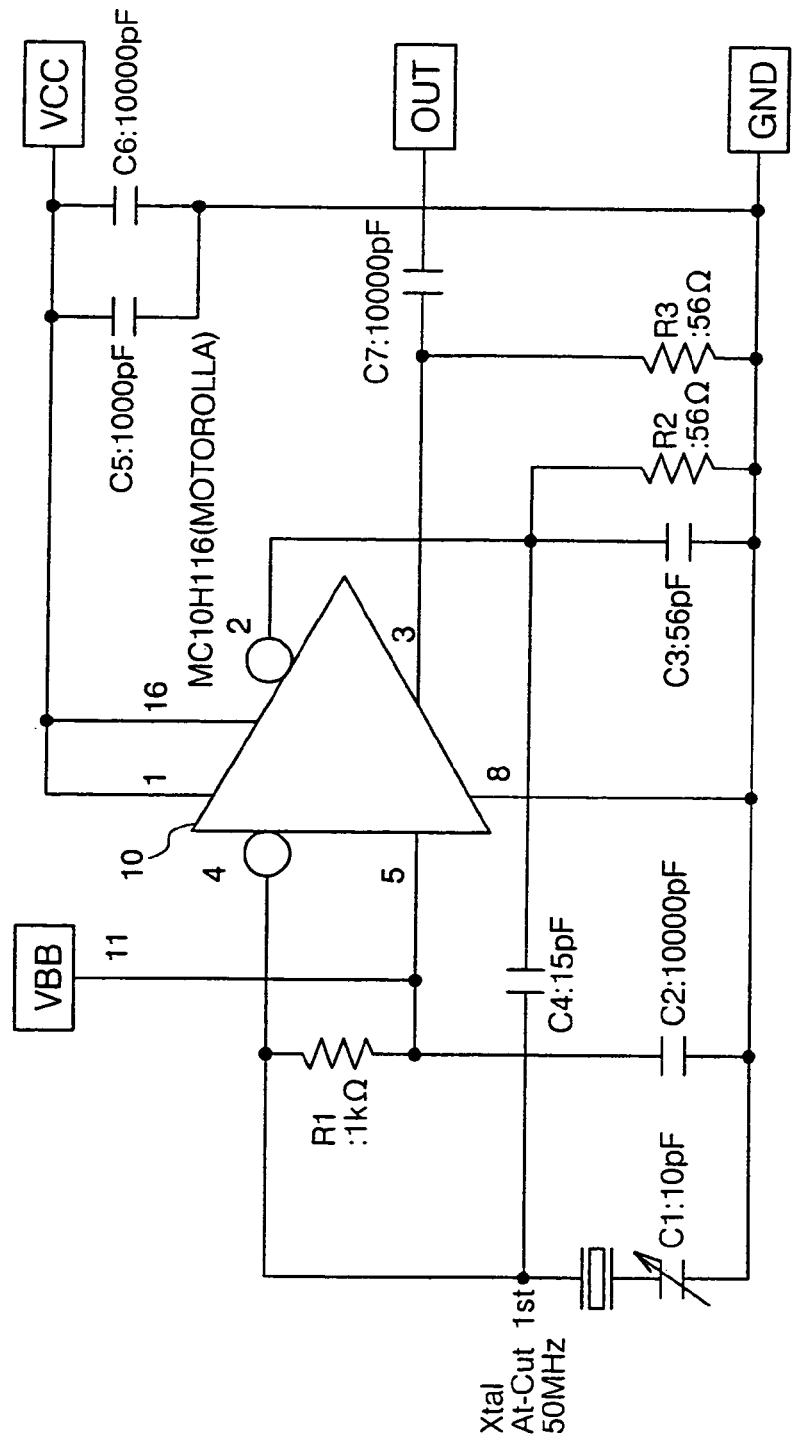
FIG. 2 is a circuit diagram illustrating an ECL oscillator according to a second embodiment of the present invention.

FIG. 2 is a circuit diagram of an ECL oscillator according to a second embodiment of the present invention. Like parts are identified by the same reference numerals as in FIG. 1 and no description will be repeated. The ECL oscillation circuit of this embodiment comprises: an ECL (Emitter Coupled Logic) circuit 10 having inverting and non-inverting input terminals 4 and 5 and inverted and non-inverted output terminals 3 and 2; a frequency control capacitor C1; a crystal oscillator X'tal; a resistor R1; capacitors C2 to C7; and pull-down resistors R2 and R3. This embodiment differs from the FIG. 1 embodiment in that the inverted output terminal 2 of the ECL circuit 10 is grounded via the capacitor C3 and is connected to the inverting input terminal 4 via the capacitor C4 and the resistor R1, and that the inverting input terminal 4 is grounded via the crystal oscillator X'tal and the capacitor C1. The output from this circuit is provided from the non-inverted output terminal through a capacitor C7.

Figure 3:
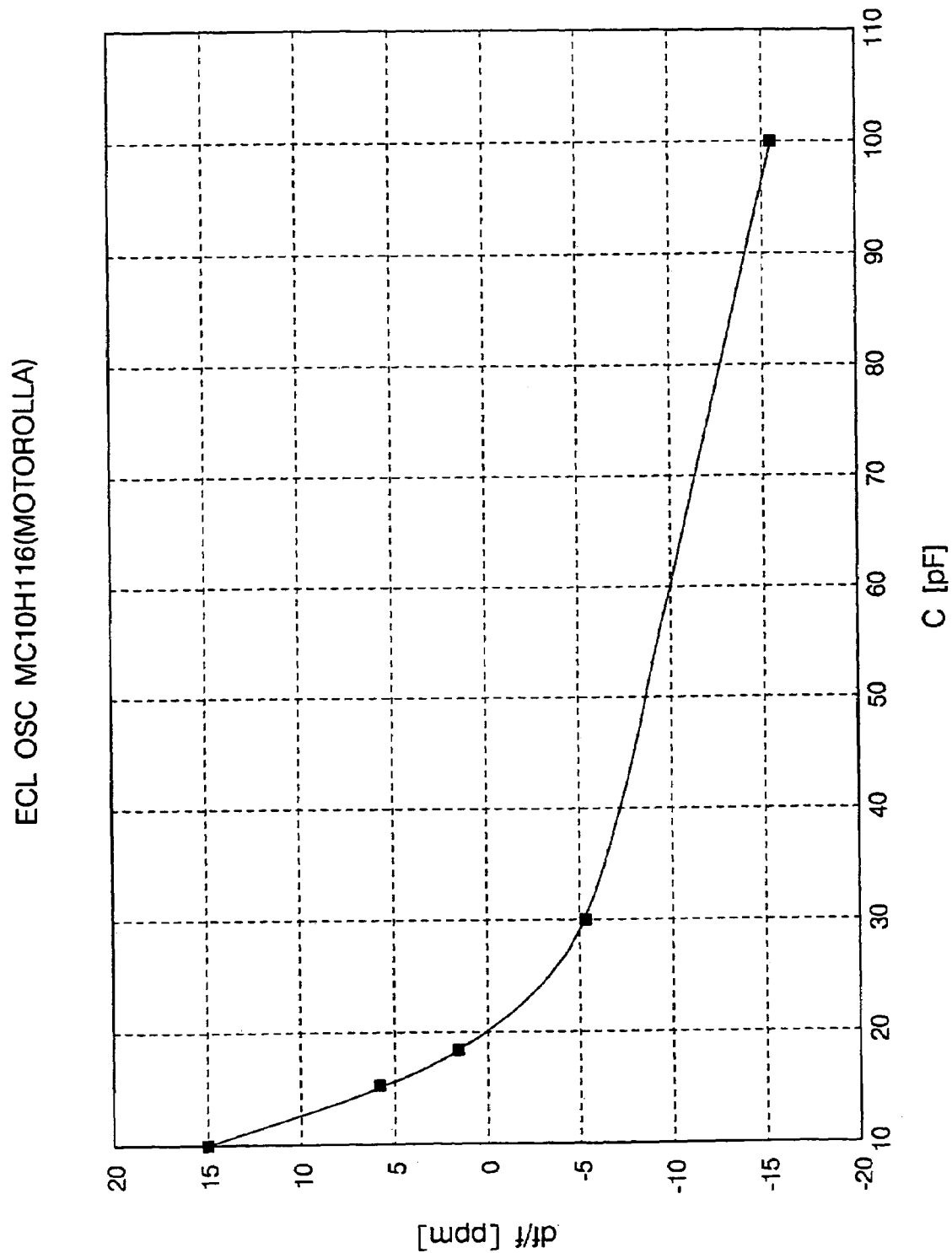
FIG. 3 is a graph showing the relationship between the capacitance of a frequency control capacitor and frequency deviation of the ECL oscillator according to the second embodiment.

FIG. 3 is a graph showing the relationship between the capacitance of the frequency control capacitor and frequency deviation of the ECL oscillator of the second embodiment. The ordinate represents the frequency deviation (ppm) and the abscissa represents the capacitance (pF) of the frequency control capacitor.

Note that the circuit constants in FIG. 2 are such as listed below. C1: variable, C2: 10000 pF, C3: 56 pF, C4: 15 pF, C5: 1000 pF, C6: 10000 pF, C7: 10000 pF, R1: 1 kΩ, R2, R3: 56 Ω, X'tal: At-cut 1st 50 MHz, ECL circuit 10: MC10H116.

As is evident from the graph, a change in the capacitance (pF) of the frequency control capacitor from 10 pF to 30 pF causes a sharp change in the frequency deviation from 15 ppm to −15 ppm, followed by a gradual change. Thus, the frequency can be changed within the range of 15 ppm to −15 ppm, centering about 20 pF.

Figure 4:
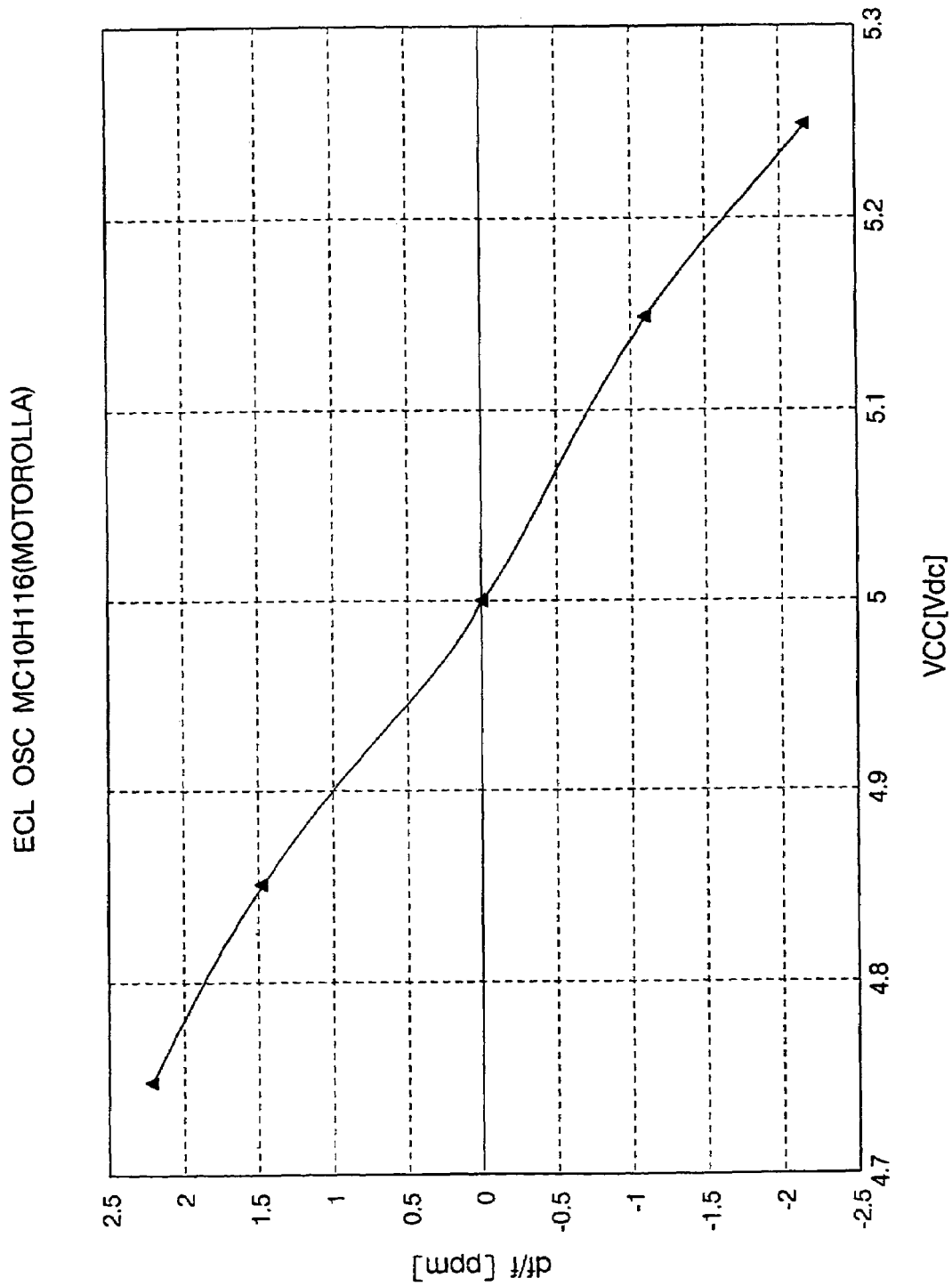
FIG. 4 is a graph showing the relationship between the power supply voltage and frequency deviation of the ECL oscillator according to the second embodiment.

FIG. 4 is a graph showing the relationship between the power supply voltage and frequency deviation of the ECL oscillator according to the second embodiment. The ordinate represents the frequency deviation (ppm) and the abscissa represents the power supply voltage (Vdc). As is evident from the graph, the frequency deviation linearly changes with an increase in the power supply voltage. This is a characteristic of the ECL oscillation circuit that the frequency deviation is suppressed within the range of ±2 ppm about the frequency at the power supply voltage of 5 Vdc, which indicates that the frequency stability is extremely high.

Figure 5:
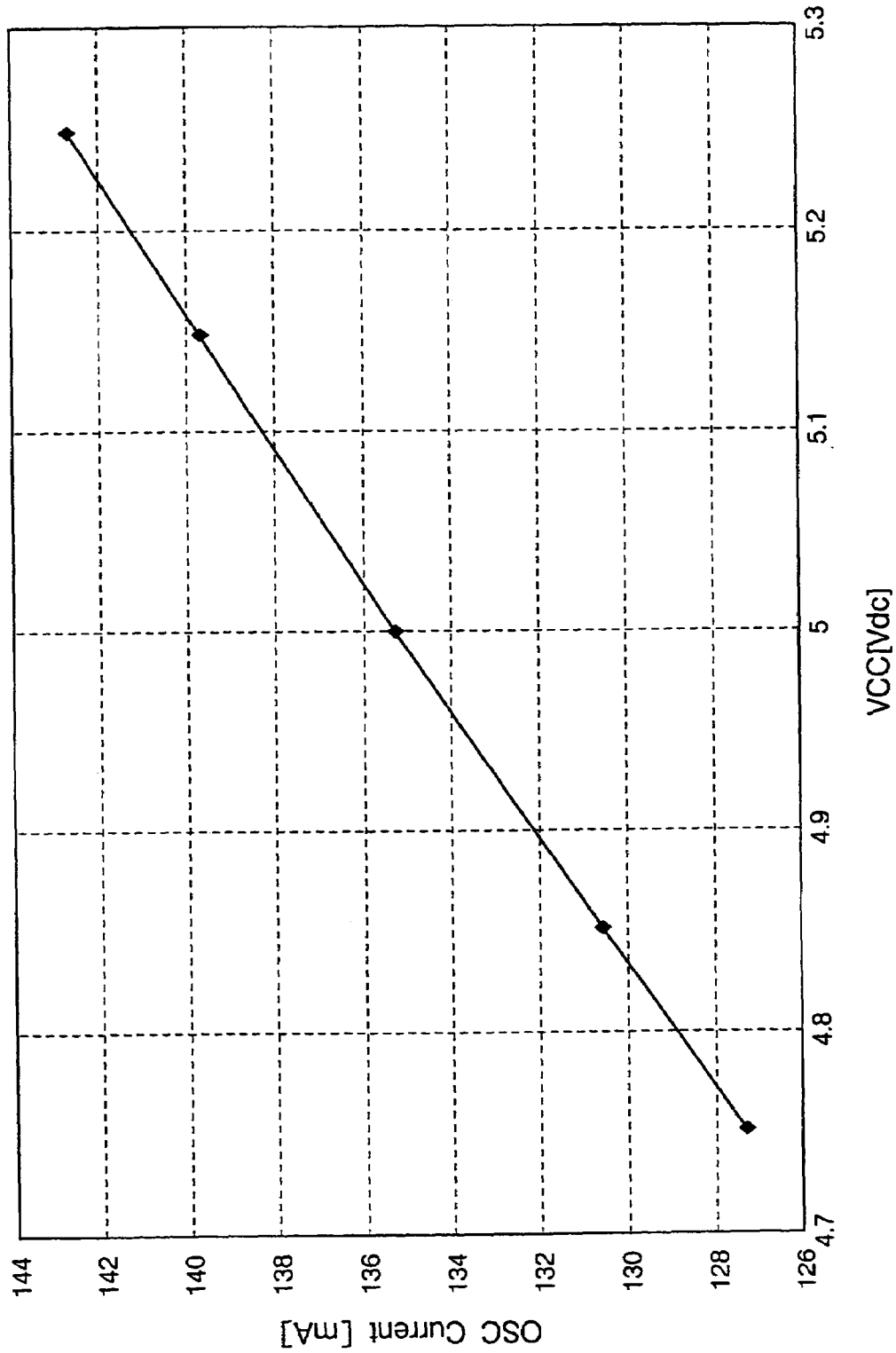
FIG. 5 is a graph showing the relationship between the power supply voltage and power consumption of the ECL oscillator according to the second embodiment.
Figure 6:
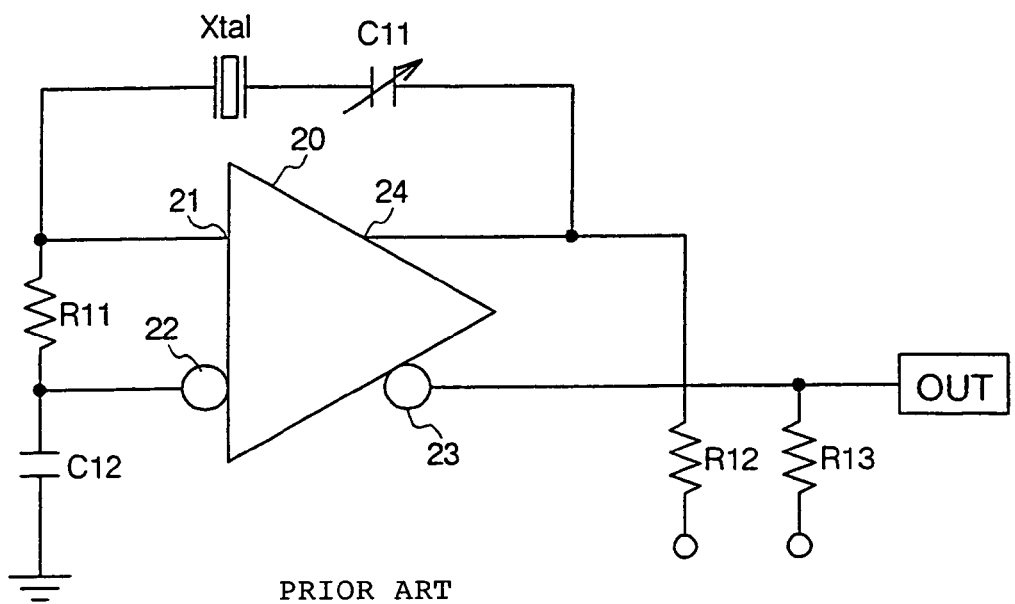
FIG. 6 is a circuit diagram of a conventional ECL oscillation circuit.

FIG. 5 is a graph showing the relationship between the power supply voltage and the current consumed by the oscillator of the ECL oscillator according to the second embodiment. The ordinatre represents the consumption current (mA) and the absissa represents the power supply voltage (Vdc). As is evident from the graph, the consumption current linearly increases from 127 mA to 143 mA with an increase in the power supply voltage causes linear increase of the consumption current.

As described above, according to the present invention, the oscillation circuit is highly stable in oscillation frequency irrespective of variations of individual ECL circuits. Furthermore, the present invention ensures stable oscillation since the values of the capacitors connected to the non-inverting and inverting input terminals of the ECL circuit, respectively, are each set to an appropriate value in view of a tradeoff between it and an equivalent series resistance of the oscillator.

What is claimed is:

1. A piezoelectric oscillator comprising:

a piezoelectric element to be excited at a predetermined frequency; and an ECL circuit for exciting said piezoelectric element by supplying current to said piezoelectric element;

wherein:

a non-inverted output terminal of said ECL circuit is grounded via a capacitor, and is connected to a non-inverting input terminal of said ECL circuit via series-connected capacitors;

said non-inverting input terminal of said ECL circuit is connected via a resistor to an inverting input terminal of said ECL circuit, and is grounded via a capacitor; and the connection point of said series-connected capacitors is grounded via said piezoelectric element and a frequency control element.

2. A piezoelectric oscillator comprising:

a piezoelectric element to be excited at a predetermined frequency; and an ECL circuit for exciting said piezoelectric element by supplying current to said piezoelectric element;

wherein:

an inverted output terminal of said ECL circuit is grounded via a capacitor, and is connected to an inverting input terminal of said ECL circuit via a capacitor;

said inverting input terminal of said ECL circuit is connected via a resistor to a non-inverting input terminal of said ECL circuit, and is grounded via a capacitor; and said inverting input terminal of said ECL circuit is grounded via said piezoelectric element and a frequency control element.

3. The piezoelectric oscillator of claim 1, wherein said series-connected capacitors, which are connected to the non-inverting and inverting input terminals of said ECL circuit, respectively, are each to set a negative resistance value of said piezoelectric oscillator.

* * * * *